(12) United States Patent
Yu et al.

(10) Patent No.: US 10,777,467 B2
(45) Date of Patent: Sep. 15, 2020

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chi-Yang Yu, Taoyuan County (TW); Chien-Kuo Chang, Hsinchu County (TW); Chih-Hao Lin, Hsinchu (TW); Jung Tsung Cheng, Hsinchu (TW); Kuan-Lin Ho, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/672,984

(22) Filed: Nov. 4, 2019

(65) Prior Publication Data

US 2020/0066598 A1 Feb. 27, 2020

Related U.S. Application Data

(62) Division of application No. 15/707,274, filed on Sep. 18, 2017, now Pat. No. 10,468,307.

(51) Int. Cl.
*H01L 21/8234* (2006.01)
*H01L 23/498* (2006.01)
(Continued)

(52) U.S. Cl.
CPC ...... *H01L 21/823481* (2013.01); *H01L 21/56* (2013.01); *H01L 23/10* (2013.01); *H01L 23/3185* (2013.01); *H01L 23/49816* (2013.01); *H01L 23/49827* (2013.01); *H01L 24/02* (2013.01); *H01L 24/92* (2013.01); *H01L 25/0657* (2013.01); *H01L 25/50* (2013.01); *H01L 23/04* (2013.01); *H01L 23/552* (2013.01); *H01L 23/562* (2013.01); *H01L 24/11* (2013.01); *H01L 24/13* (2013.01); *H01L 24/16* (2013.01); *H01L 24/17* (2013.01); *H01L 24/29* (2013.01); *H01L 24/32* (2013.01); *H01L 24/33* (2013.01); *H01L 24/81* (2013.01); *H01L 24/83* (2013.01); *H01L 2224/1132* (2013.01); *H01L 2224/11334* (2013.01); *H01L 2224/131* (2013.01); *H01L 2224/13024* (2013.01);
(Continued)

(58) Field of Classification Search
CPC combination set(s) only.
See application file for complete search history.

(56) References Cited

U.S. PATENT DOCUMENTS

| 2008/0164470 | A1* | 7/2008 | Wang | H01L 27/1214 257/59 |
| 2015/0235990 | A1* | 8/2015 | Cheng | H01L 25/50 257/712 |
| 2015/0318246 | A1* | 11/2015 | Yu | H01L 23/00 257/774 |

* cited by examiner

*Primary Examiner* — Ratisha Mehta
(74) *Attorney, Agent, or Firm* — WPAT, P.C., Intellectual Property Attorneys; Anthony King

(57) ABSTRACT

A semiconductor structure includes a substrate including a first surface and a second surface opposite to the first surface; a dielectric layer disposed over the second surface or below the first surface; a polymeric layer disposed over or below the dielectric layer; an isolation layer surrounding and contacted with the substrate, the dielectric layer and the polymeric layer; a die disposed over the polymeric layer; a first conductive bump disposed below the first surface of the substrate; and a second conductive bump disposed between the second surface of the substrate and the die.

20 Claims, 10 Drawing Sheets

(51) Int. Cl.
  *H01L 23/31*     (2006.01)
  *H01L 21/56*     (2006.01)
  *H01L 23/00*     (2006.01)
  *H01L 25/065*    (2006.01)
  *H01L 23/10*     (2006.01)
  *H01L 25/00*     (2006.01)
  *H01L 23/552*        (2006.01)
  *H01L 23/04*         (2006.01)

(52) U.S. Cl.
  CPC .............. *H01L 2224/13111* (2013.01); *H01L 2224/13116* (2013.01); *H01L 2224/16145* (2013.01); *H01L 2224/16146* (2013.01); *H01L 2224/16227* (2013.01); *H01L 2224/16235* (2013.01); *H01L 2224/17181* (2013.01); *H01L 2224/2919* (2013.01); *H01L 2224/32245* (2013.01); *H01L 2224/33181* (2013.01); *H01L 2224/73204* (2013.01); *H01L 2224/73253* (2013.01); *H01L 2224/81815* (2013.01); *H01L 2224/83102* (2013.01); *H01L 2224/83104* (2013.01); *H01L 2224/9202* (2013.01); *H01L 2224/92222* (2013.01); *H01L 2224/92225* (2013.01); *H01L 2224/92242* (2013.01); *H01L 2225/06513* (2013.01); *H01L 2225/06537* (2013.01); *H01L 2225/06541* (2013.01); *H01L 2225/06568* (2013.01); *H01L 2225/06589* (2013.01); *H01L 2924/15311* (2013.01); *H01L 2924/16724* (2013.01); *H01L 2924/16747* (2013.01); *H01L 2924/3025* (2013.01); *H01L 2924/3512* (2013.01)

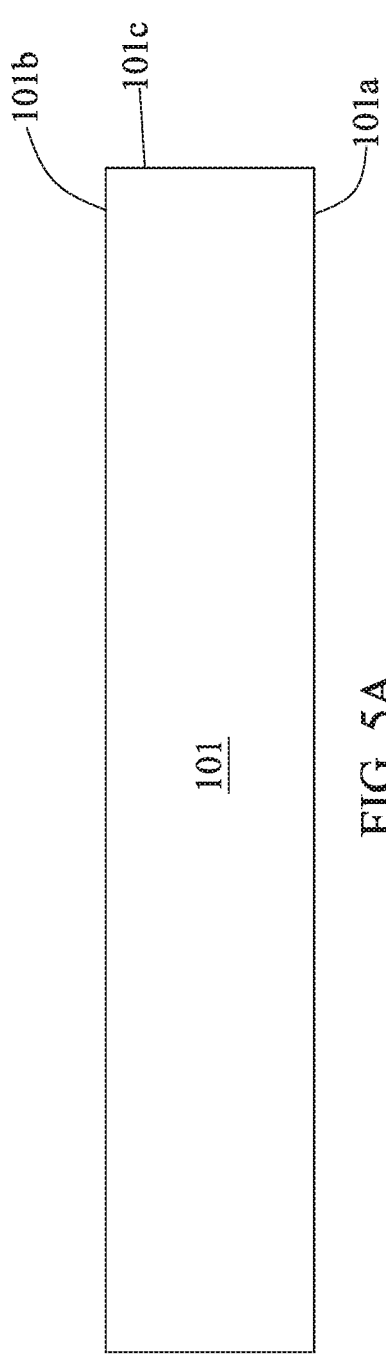
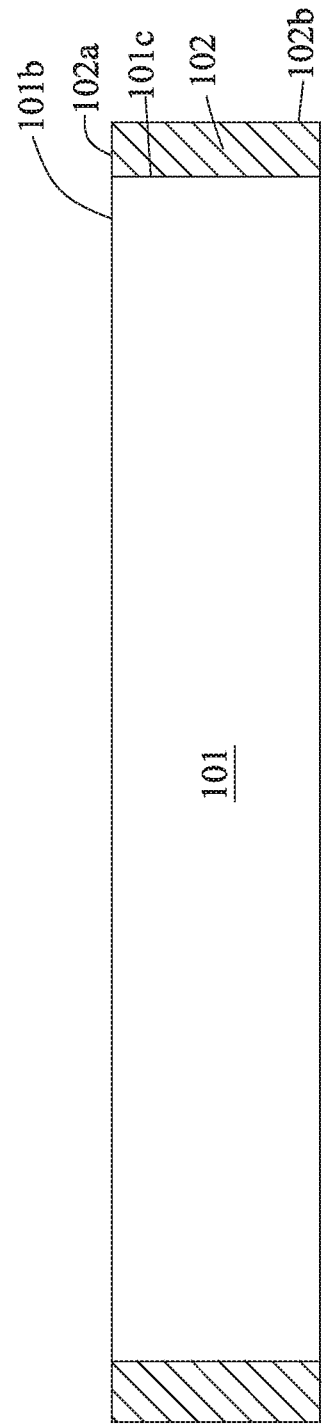

SEMICONDUCTOR STRUCTURE AND MANUFACTURING METHOD THEREOF

PRIORITY CLAIM AND CROSS-REFERENCE

This application is a divisional application of U.S. non-provisional application Ser. No. 15/707,274 filed on Sep. 18, 2017, entitled "SEMICONDUCTOR STRUCTURE AND MANUFACTURING METHOD THEREOF," the disclosure of which is hereby incorporated by reference in its entirety.

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, packaging is widely used for its low cost and relatively simple manufacturing operations. During the packaging operations, a number of semiconductor components are assembled on the semiconductor device. Furthermore, numerous manufacturing operations are implemented within such a small semiconductor device.

However, the manufacturing operations of the semiconductor device involve many steps and operations on such a small and thin semiconductor device. The manufacturing of the semiconductor device in a miniaturized scale becomes more complicated. An increase in a complexity of manufacturing the semiconductor device may cause deficiencies such as chippings, development of cracks, delamination of the components or high yield loss of the semiconductor device. The semiconductor device is produced in an undesired configuration, which would further exacerbate materials wastage and thus increase the manufacturing cost. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5A-5D are schematic views of manufacturing a semiconductor structure by a method of FIG. 4 in accordance with some embodiments of the present disclosure.

DETAILED DESCRIPTION OF THE DISCLOSURE

Figure 1:
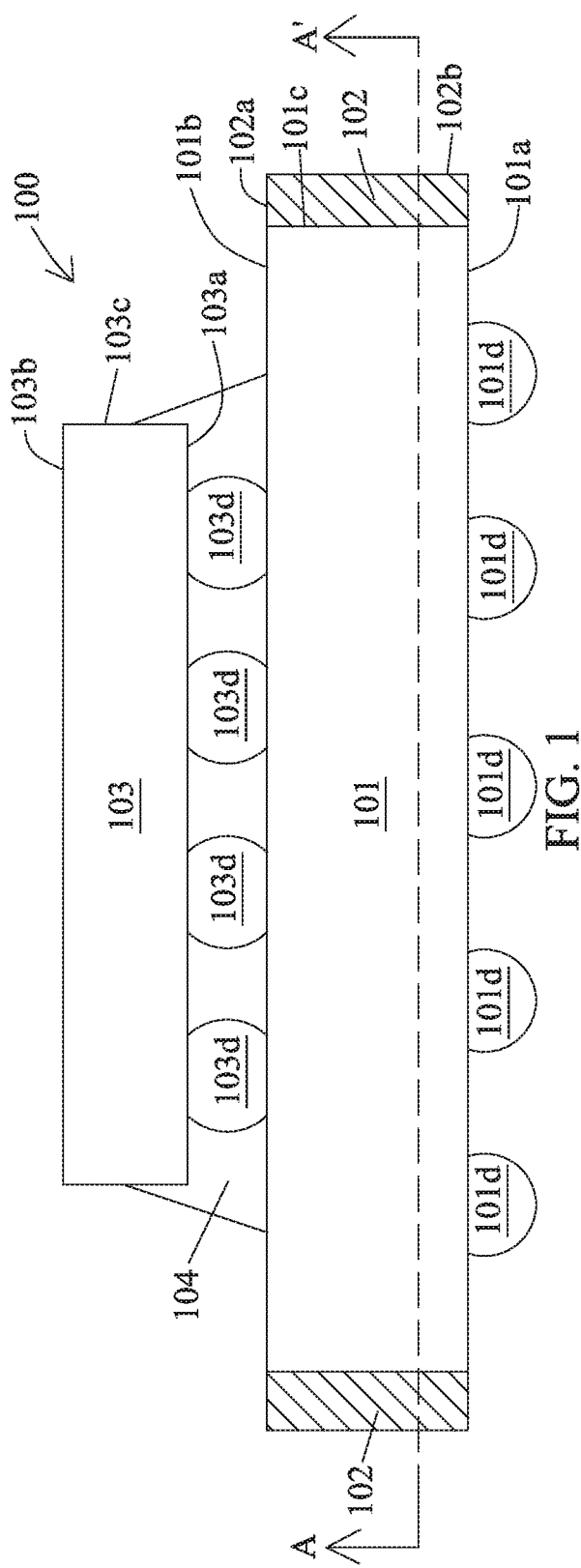
FIG. 1 is a schematic cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A semiconductor structure is manufactured by a number of operations. The semiconductor structure is manufactured by cutting a substrate and disposing components on the substrate. Cracks are easily developed upon cutting of the substrate. The present of cracks would result in a high stress within the substrate, and the crack may propagate towards a central portion of the substrate to further weaken the substrate or the semiconductor structure. Furthermore, small chips or fragments are produced during the cutting of the substrate. Those small chips peeled out from the substrate during the cutting operation would temporarily attach on the saw blade or dispose over the sidewall of the substrate, which would further induce development of cracks over the sidewall of the substrate. The components on the substrate may be easily delaminated from the substrate when cracks are developed or chips are disposed over the substrate. Reliability and performance of the semiconductor structure would be adversely affected.

In the present disclosure, a semiconductor structure is disclosed. The semiconductor structure includes a substrate surrounded by an isolation layer. The isolation layer covers a sidewall of the substrate to protect the substrate and components on the substrate. As such, components delaminated from the substrate and cracks propagated into the substrate would be minimized or prevented. Reliability and performance of the semiconductor structure are improved.

FIG. 1 is a schematic cross sectional view of a semiconductor structure 100 in accordance with some embodiments of the present disclosure. In some embodiments, the semiconductor structure 100 includes a substrate 101, an isolation layer 102 around the substrate 101 and a die 103 disposed over the substrate 101.

In some embodiments, the semiconductor structure 100 is a semiconductor package. In some embodiments, the semiconductor structure 100 is a flip chip package. In some embodiments, the semiconductor structure 100 is a flip chip ball grid array (FCBGA). In some embodiments, the semiconductor structure 100 is a chip on wafer (CoW) structure. In some embodiments, the semiconductor structure 100 is a three dimensional integrated circuit (3D IC).

In some embodiments, the substrate 101 is fabricated with a predetermined functional circuit over the substrate 101. In some embodiments, the substrate 101 includes several conductive lines and several electrical components such as transistor, diode, etc. connected by the conductive lines. In some embodiments, the substrate 101 is a semiconductive substrate. In some embodiments, the substrate 101 includes semiconductive material such as silicon, germanium, gallium, arsenic, or combinations thereof. In some embodiments, the substrate 101 is a core substrate. In some embodiments, the substrate 101 includes organic material. In some embodiments, the substrate 101 includes epoxy, resin or glass fiber. In some embodiments, a cross sectional area of the substrate 101 is in a quadrilateral, rectangular, square, polygonal or any other suitable shapes.

In some embodiments, the substrate 101 includes a first surface 101a, a second surface 101b opposite to the first surface 101a and a first sidewall 101c substantially orthogonal to the first surface 101a and the second surface 101b. In some embodiments, the first sidewall 101c is extended between the first surface 101a and the second surface 101b. In some embodiments, the first surface 101a is substantially parallel to the second surface 101b.

In some embodiments, several protrusions or several recesses are disposed on the first sidewall 101c of the substrate 101. In some embodiments, the protrusions and the recesses are disposed over a portion of the first sidewall 101c. In some embodiments, the protrusions are laterally protruded from the first sidewall 101c. In some embodiments, the recesses are laterally indented into the substrate 101. In some embodiments, the protrusions and the recesses disposed on the first sidewall 101c are cracks which are developed during fabrication of the substrate 101 such as singulation, cutting, sawing or etc. In some embodiments, the protrusions and the recesses disposed on the first sidewall 101c are developed by chippings which are formed during fabrication of the substrate 101 such as singulation, cutting, sawing or etc.

In some embodiments, a roughness of the first sidewall 101c is substantially greater than a roughness of the first surface 101a and a roughness of the second surface 101b of the substrate 101. In some embodiments, the roughness of the first sidewall 101c is substantially different from the roughness of the first surface 101a and the roughness of the second surface 101b of the substrate 101.

In some embodiments, a first conductive bump 101d is disposed at the first surface 101a of the substrate 101. In some embodiments, the first conductive bump 101d is disposed below the first substrate 101. In some embodiments, the first conductive bump 101d is protruded from the first surface 101a of the substrate 101. In some embodiments, the first conductive bump 101d is configured to bond with a conductive structure. In some embodiments, the first conductive bump 101d is electrically connected with the substrate 101. In some embodiments, the first conductive bump 101d includes low-temperature reflowable material, such as solder, a lead-free solder, etc. In some embodiments, the first conductive bump 101d includes lead, tin, copper, gold, nickel or the like or combination thereof. In some embodiments, the first conductive bump 101d is a solder ball, a ball grid array (BGA) ball, a controlled collapse chip connection (C4) bump, a microbump, a pillar or the like. In some embodiments, the first conductive bump 101d is in a spherical or hemispherical shape.

In some embodiments, the isolation layer 102 surrounds the substrate 101. In some embodiments, the isolation layer 102 is disposed at a side of the substrate 101. In some embodiments, the isolation layer 102 is contacted with the substrate 101. In some embodiments, the isolation layer 102 is contacted with the first sidewall 101c of the substrate 101. In some embodiments, the isolation layer 102 is extended along and disposed conformal to the first sidewall 101c of the substrate 101. In some embodiments, the isolation layer 102 is extended along a thickness of the substrate 101. In some embodiments, the isolation layer 102 is vertically extended. In some embodiments, the first sidewall 101c of the substrate 101 is entirely covered by the isolation layer 102. In some embodiments, the isolation layer 102 is disposed over a portion of the first surface 101a or a portion of the second surface 101b to cover a corner of the substrate 101.

In some embodiments, the isolation layer 102 is configured to protect the substrate 101 from damages, chippings or other contaminations. In some embodiments, the isolation layer 102 is configured to seal cracks developed at the first sidewall 101c of the substrate 101 or prevent propagation of cracks into the substrate 101. In some embodiments, the isolation layer 102 is configured to seal gap between the protrusions or between the recesses.

In some embodiments, the isolation layer 102 includes polymeric, metallic or conductive material. In some embodiments, the isolation layer 102 includes solder mask, solder resist, epoxy, polyimide (PI), polybenzoxazole (PBO), molding compound or the like. In some embodiments, the isolation layer 102 includes aluminum, copper, nickel, gold, silver or the like. In some embodiments, the isolation layer 102 is a polymeric film. In some embodiments, the isolation layer 102 is an electromagnetic shield for electromagnetically isolating the substrate 101 from the surroundings.

In some embodiments, the isolation layer 102 includes a third surface 102a and a second sidewall 102b substantially orthogonal to the third surface 102a. In some embodiments, the third surface 102a is substantially coplanar with the first surface 101a or the second surface 101b of the substrate 101. In some embodiments, the second sidewall 102b is substantially parallel to the first sidewall 101c of the substrate 101. In some embodiments, an interface between the substrate 101 and the isolation layer 102 is substantially parallel to the second sidewall 102b of the isolation layer 102.

Figure 2:
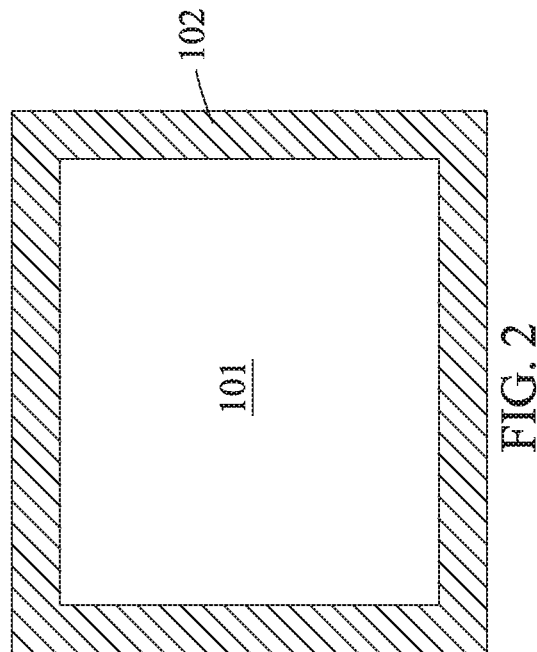
FIG. 2 is a schematic top cross-sectional view of the semiconductor structure of FIG. 1 along AA'.

In some embodiments as shown in FIG. 2, the isolation layer 102 is in a strip or frame shape. In some embodiments, the isolation layer 102 is disposed along and contacted with edges of the substrate 101. In some embodiments, the substrate 101 is enclosed by the isolation layer 102.

Referring back to FIG. 1, in some embodiments, the die 103 is disposed over the substrate 101. In some embodiments, the die 103 is disposed over the second surface 101b of the substrate 101. In some embodiments, the die 103 includes a fourth surface 103a facing to the second surface 101b of the substrate 101, a fifth surface 103b opposite to the fourth surface 103a and a third sidewall 103c substantially orthogonal to the fourth surface 103a and the fifth surface 103b. In some embodiments, the third sidewall 103c is extended between the fourth surface 103a and the fifth surface 103b. In some embodiments, the fourth surface 103a is substantially parallel to the fifth surface 103b.

In some embodiments, the die 103 is fabricated with a predetermined functional circuit within the die 103. In some embodiments, the die 103 is singulated from a semiconductive wafer by a mechanical or laser blade. In some embodiments, the die 103 comprises a variety of electrical circuits suitable for a particular application. In some embodiments, the electrical circuits include various devices such as transistors, capacitors, resistors, diodes and/or the like. In some embodiments, the die 103 is a logic device die, graphics processing unit (GPU) die, application processing (AP) die, memory die, high bandwidth memory (HBM) die or the like. In some embodiments, the die 103 is a chip or a package. In some embodiments, the die 103 has a top cross section (a cross section from the top view of the semiconductor structure 100 as shown in FIG. 1) in a quadrilateral, a rectangular or a square shape.

In some embodiments, a second conductive bump 103d is disposed between the substrate 101 and the die 103. In some embodiments, the die 103 is bonded over the substrate 101 by the second conductive bump 103d. In some embodiments, the second conductive bump 103d is disposed at the fourth surface 103a of the die 103 and the second surface 101b of the substrate 101. In some embodiments, the second conductive bump 103d is protruded from the fourth surface 103a of the die 103. In some embodiments, the second conductive bump 103d is configured to bond with a conductive structure. In some embodiments, the second conductive bump 103d is electrically connected with the die 103. In some embodiments, the die 103 is electrically connected to the substrate 101 through the second conductive bump 103d.

In some embodiments, the second conductive bump 103d includes low-temperature reflowable material, such as solder, a lead-free solder, etc. In some embodiments, the second conductive bump 103d includes lead, tin, copper, gold, nickel or the like or combination thereof. In some embodiments, the second conductive bump 103d is a solder ball, a flip chip bump, a ball grid array (BGA) ball, a controlled collapse chip connection (C4) bump, a microbump, a pillar or the like. In some embodiments, the second conductive bump 103d is in a spherical or hemispherical shape.

In some embodiments, an underfill material 104 is disposed between the die 103 and the substrate 101. In some embodiments, the underfill material 104 surrounds the second conductive bump 103d and a portion of the die 103. In some embodiments, the underfill material 104 is in contact with the third sidewall 103c of the die 103, the second surface of the substrate 101 and the second conductive bump 103d. In some embodiments, the underfill material 104 fills spacing between two adjacent second conductive bumps 103d. In some embodiments, the underfill material 104 is an electrically insulated adhesive for protecting the second conductive bump 103d or securing a bonding between the die 103 and the substrate 101. In some embodiments, the underfill material 104 includes epoxy, resin, epoxy molding compounds or etc.

Figure 3:
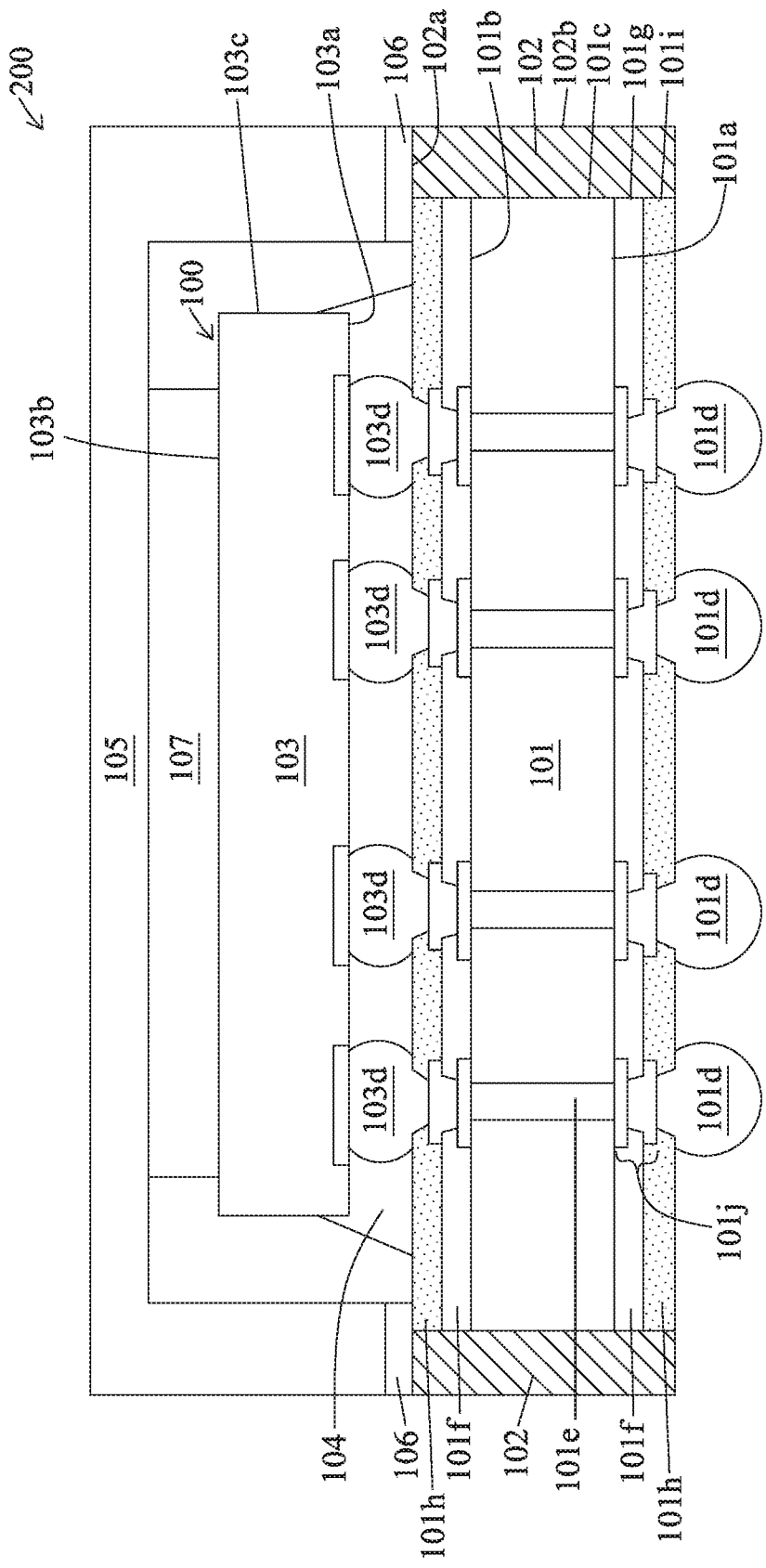
FIG. 3 is a schematic cross-sectional view of a semiconductor structure in accordance with some embodiments of the present disclosure.

FIG. 3 is a schematic cross sectional view of a semiconductor structure 200 in accordance with some embodiments of the present disclosure. In some embodiments, the semiconductor structure 200 includes a substrate 101, an isolation layer 102 around the substrate 101 and a die 103 disposed over the substrate 101, which have similar configurations as those described above or illustrated in FIG. 1.

In some embodiments, a via 101e is disposed within the substrate 101. In some embodiments, the via 101e is extended through the substrate 101. In some embodiments, the via 101e is extended between the first surface 101a and the second surface 101b of the substrate 101. In some embodiments, the via 101e includes a conductive material such as copper, silver, gold, aluminum, etc. In some embodiments, the via 101e is a through substrate via or a through silicon via (TSV). In some embodiments, the via 101e is surrounded by the isolation layer 102. In some embodiments, the via 101e is electrically connected to the first conductive bump 101d, the second conductive bump 103d or the die 103.

In some embodiments, a dielectric layer 101f is disposed over the second surface 101b or below the first surface 101a of the substrate 101. In some embodiments, the dielectric layer 101f includes one or more layers of dielectric material disposed or stacked over each other. In some embodiments, the dielectric layer 101f includes dielectric material such as silicon oxide, silicon carbide, silicon oxynitride, silicon nitride or the like.

In some embodiments, the dielectric layer 101f is surrounded by the isolation layer 102. In some embodiments, the isolation layer 102 contacts with the dielectric layer 101f. In some embodiments, the isolation layer 102 contacts with a fourth sidewall 101g of the dielectric layer 101f. In some embodiments, the fourth sidewall 101g is substantially coplanar with the first sidewall 101c of the substrate. In some embodiments, the fourth sidewall 101g is substantially parallel to the second sidewall 102b of the isolation layer 102. In some embodiments, the isolation layer 102 is configured to protect the dielectric layer 101f from damages or contaminations and to prevent delamination of the dielectric layer 101f.

In some embodiments, several protrusions or several recesses are disposed on the fourth sidewall 101g of the dielectric layer 101f. In some embodiments, the protrusions and the recesses are disposed over a portion of the fourth sidewall 101g. In some embodiments, the protrusions are laterally protruded from the fourth sidewall 101g. In some embodiments, the recesses are laterally indented into the dielectric layer 101f. In some embodiments, the protrusions and the recesses are cracks which are developed during fabrication of the semiconductor structure 200 such as singulation, cutting, sawing or etc. In some embodiments, the protrusions and the recesses are developed by chippings which are formed during fabrication of the semiconductor structure 200 such as singulation, cutting, sawing or etc.

In some embodiments, a polymeric layer 101h is disposed over or below the dielectric layer 101f. In some embodiments, the polymeric layer 101h includes polymeric material such as solder mask, solder resist, epoxy, polyimide (PI), polybenzoxazole (PBO) or the like. In some embodiments, the polymeric layer 101h is a solder mask for surrounding the first conductive bump 101d or the second conductive bump 103d. In some embodiments, the polymeric layer 101h is exposed.

In some embodiments, the polymeric layer 101h is surrounded by the isolation layer 102. In some embodiments, the isolation layer 102 contacts with the polymeric layer 101h. In some embodiments, the isolation layer 102 surrounds and contacts with the substrate 101, the dielectric layer 101f and the polymeric layer 101h. In some embodiments, the isolation layer 102 contacts with a fifth sidewall 101i of the polymeric layer 101h. In some embodiments, the isolation layer 102 surrounds and contacts with the first sidewall 101c of the substrate 101, the fourth sidewall 101g of the dielectric layer 101f and the fifth sidewall 101i of the polymeric layer 101h. In some embodiments, the die 103 is disposed over the polymeric layer 101h. In some embodiments, the isolation layer 102 is configured to protect the polymeric layer 101h from damages or contaminations and to prevent delamination of the polymeric layer 101h.

In some embodiments, the isolation layer 102 entirely covers the first sidewall 101c of the substrate 101, the fourth sidewall 101g of the dielectric layer 101f and the fifth sidewall 101i of the polymeric layer 101h. In some embodiments, the fifth sidewall 101i is substantially coplanar with the first sidewall 101c of the substrate and the fourth sidewall 101g of the dielectric layer 101f. In some embodiments, the polymeric layer 101h is substantially parallel to the second sidewall 102b of the isolation layer 102. In some embodiments, an interface between the isolation layer 102, the substrate 101, the dielectric layer 101f and the polymeric layer 101h is substantially orthogonal to the first surface 101a or the second surface 101b of the substrate 101.

In some embodiments, several protrusions or several recesses are disposed on the fifth sidewall 101i of the polymeric layer 101h. In some embodiments, the protrusions and the recesses are disposed over a portion of the fifth sidewall 101i. In some embodiments, the protrusions are laterally protruded from the fifth sidewall 101i. In some embodiments, the recesses are laterally indented into the polymeric layer 101h. In some embodiments, the protrusions and the recesses disposed on the fifth sidewall 101i are cracks which are developed during fabrication of the semiconductor structure 200 such as singulation, cutting, sawing or etc. In some embodiments, the protrusions and the recesses disposed on the fifth sidewall 101i are developed by chippings which are formed during fabrication of the semiconductor structure 200 such as singulation, cutting, sawing or etc.

In some embodiments, a roughness of the fourth sidewall 101g is substantially greater than the roughness of the first surface 101a, the roughness of the second surface 101b of the substrate 101 or a roughness of the surface of the dielectric layer 101f between the dielectric layer 101f and the polymeric layer 101h. In some embodiments, the roughness of the fourth sidewall 101g is substantially different from the roughness of the first surface 101a, the roughness of the second surface 101b of the substrate 101 or the roughness of the surface of the dielectric layer 101f between the dielectric layer 101f and the polymeric layer 101h.

In some embodiments, a roughness of the fifth sidewall 101i is substantially greater than the roughness of the first surface 101a, the roughness of the second surface 101b of the substrate 101, the roughness of the surface of the dielectric layer 101f between the dielectric layer 101f and the polymeric layer 101h, or a roughness of a surface of the polymeric layer 101h exposed from the underfill material 104. In some embodiments, the roughness of the fifth sidewall 101i is substantially different from the roughness of the second surface 101b of the substrate 101, the roughness of the surface of the dielectric layer 101f between the dielectric layer 101f and the polymeric layer 101h, or the roughness of the surface of the polymeric layer 101h exposed from the underfill material 104.

In some embodiments, a conductive member 101j is surrounded by the dielectric layer 101f or the polymeric layer 101h. In some embodiments, the conductive member 101j is extended within the dielectric layer 101f or within the polymeric layer 101h. In some embodiments, the conductive member 101j is electrically connected to the first conductive bump 101d or the second conductive bump 103d. In some embodiments, the conductive member 101j is electrically connected with the via 101e. In some embodiments, the conductive member 101j is disposed over or below the via 101e. In some embodiments, the first conductive bump 101d is disposed over or below the conductive member 101j. In some embodiments, the second conductive bump 103d is disposed over the conductive member 101j. In some embodiments, the die 103 is electrically connected to the first conductive bump 101d, the conductive member 101j, the second conductive bump 103d or the via 101e. In some embodiments, the conductive member 101j is a conductive pad, a conductive line, a bump pad, an interconnect structure or the like.

In some embodiments, a heat dissipation member 105 is disposed over the die 103, the substrate 101 and the isolation layer 102. In some embodiments, the heat dissipation member 105 is disposed over at least a portion of the polymeric layer 101h and at least a portion of the dielectric layer 101f. In some embodiments, the heat dissipation member 105 encloses the die 103. In some embodiments, the heat dissipation member 105 is attached to the isolation layer 102 by an adhesive 106. In some embodiments, the heat dissipation member 105 is attached to a portion of the isolation layer 102 and a portion of the polymeric layer 101h by the adhesive 106. In some embodiments, the heat dissipation member 105 is attached to the polymeric layer 101h by the adhesive 106. In some embodiments, the heat dissipation member 105 is configured to dissipate a heat from the die 103 to an ambient environment. In some embodiments, the heat dissipation member 105 includes thermally conductive material such as aluminum, copper or etc. In some embodiments, the heat dissipation member 105 is a heat sink or a heat spreader.

In some embodiments, a thermal interface material (TIM) 107 is disposed between the heat dissipation member 105 and the die 103. In some embodiments, the TIM 107 is disposed on the fifth surface 103b of the die 103. In some embodiments, the TIM 107 is configured to transfer heat from the die 103 to the heat dissipation member 105. In some embodiments, the TIM 107 is thermal adhesive, thermal gel, thermal tape or the like.

Figure 4:
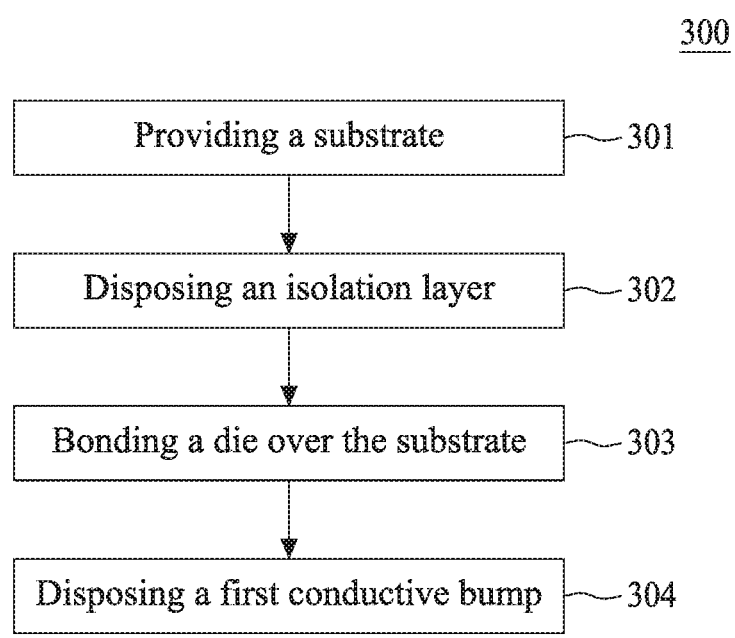
FIG. 4 is a flow diagram of a method of manufacturing a semiconductor structure in accordance with some embodiments of the present disclosure.

In some embodiments, a semiconductor structure 100 is formed by a method 300. The method 300 includes a number of operations and the description and illustration are not deemed as a limitation as the sequence of the operations. FIG. 4 is an embodiment of the method 300 of manufacturing the semiconductor structure 100. The method 300 includes a number of operations (301, 302, 303 and 304).

In operation 301, a substrate 101 is received or provided as shown in FIG. 5A. In some embodiments, the substrate 101 is a semiconductive substrate. In some embodiments, the substrate 101 includes semiconductive material such as silicon, germanium, gallium, arsenic, or combinations thereof. In some embodiments, the substrate 101 is a core substrate. In some embodiments, the substrate 101 includes organic material. In some embodiments, the substrate 101 includes epoxy, resin or glass fiber.

In some embodiments, the substrate 101 includes a first surface 101a, a second surface 101b opposite to the first surface 101a and a first sidewall 101c substantially orthogonal to the first surface 101a and the second surface 101b. In some embodiments, the first sidewall 101c is extended between the first surface 101a and the second surface 101b. In some embodiments, the substrate 101 has configuration similar to the one described above or illustrated in FIG. 1, 2 or 3.

In some embodiments, the substrate 101 is formed by singulation, cutting, sawing or other similar operations. In some embodiments, the substrate 101 is sawn to form the first sidewall 101c. In some embodiments, several protrusions or several recesses are formed on the first sidewall 101c of the substrate 101 after the singulation, cutting or sawing operations. In some embodiments, the protrusions and the recesses are formed over a portion of the first sidewall 101c. In some embodiments, the protrusions and the recesses formed on the first sidewall 101c are cracks which are developed during fabrication of the substrate 101 such as singulation, cutting, sawing or other similar operations. In some embodiments, chippings are formed during fabrication of the substrate 101 such as singulation, cutting, sawing or other similar operations, and those chippings collide with the substrate 101 to form cracks on the substrate 101.

In some embodiments, a roughness of the first sidewall 101c is substantially greater than a roughness of the first surface 101a and a roughness of the second surface 101b of the substrate 101, because the first sidewall 101c has undergone cutting operations. In some embodiments, the roughness of the first sidewall 101c is substantially different from the roughness of the first surface 101a and the roughness of the second surface 101b of the substrate 101.

In operation 302, an isolation layer 102 is disposed as shown in FIG. 5B. In some embodiments, the isolation layer 102 surrounds and contacts with the first sidewall 101c of the substrate 101. In some embodiments, the isolation layer 102 is extended along and disposed conformal to the first sidewall 101c of the substrate 101. In some embodiments, the isolation layer 102 is extended along a thickness of the substrate 101. In some embodiments, the isolation layer 102 is vertically extended. In some embodiments, the first sidewall 101c of the substrate 101 is entirely covered by the isolation layer 102. In some embodiments, the isolation layer 102 is disposed by coating, rolling, sticking, molding or any other suitable operations. In some embodiments, the isolation layer 102 is coated on or attached to the first sidewall 101c. In some embodiments, the isolation layer 102 is molded along all edges of the substrate 101. In some embodiments, the cutting of the substrate 101 and formation of the first sidewall 101c of the substrate 101 are performed before the disposing of the isolation layer 102.

In some embodiments, the isolation layer 102 is configured to protect the substrate 101 from damages, chippings or other contaminations. In some embodiments, the isolation layer 102 is configured to seal cracks developed at the first sidewall 101c of the substrate 101 or prevent propagation of cracks into the substrate 101. In some embodiments, the isolation layer 102 is configured to seal gap between the protrusions or between the recesses.

In some embodiments, the isolation layer 102 includes polymeric, metallic or conductive material. In some embodiments, the isolation layer 102 includes solder mask, solder resist, epoxy, polyimide (PI), polybenzoxazole (PBO), molding compound or the like. In some embodiments, the isolation layer 102 includes aluminum, copper, nickel, gold, silver or the like. In some embodiments, the isolation layer 102 is a polymeric film. In some embodiments, the isolation layer 102 is an electromagnetic shield for electromagnetically isolating the substrate 101 from the surroundings.

In some embodiments, the isolation layer 102 includes a third surface 102a and a second sidewall 102b substantially orthogonal to the third surface 102a. In some embodiments, the third surface 102a is substantially coplanar with the first surface 101a or the second surface 101b of the substrate 101. In some embodiments, the second sidewall 102b is substantially parallel to the first sidewall 101c of the substrate 101. In some embodiments, an interface between the substrate 101 and the isolation layer 102 is substantially parallel to the second sidewall 102b of the isolation layer 102. In some embodiments, the isolation layer 102 has configuration similar to the one described above or illustrated in FIG. 1, 2 or 3.

Figure 5C:
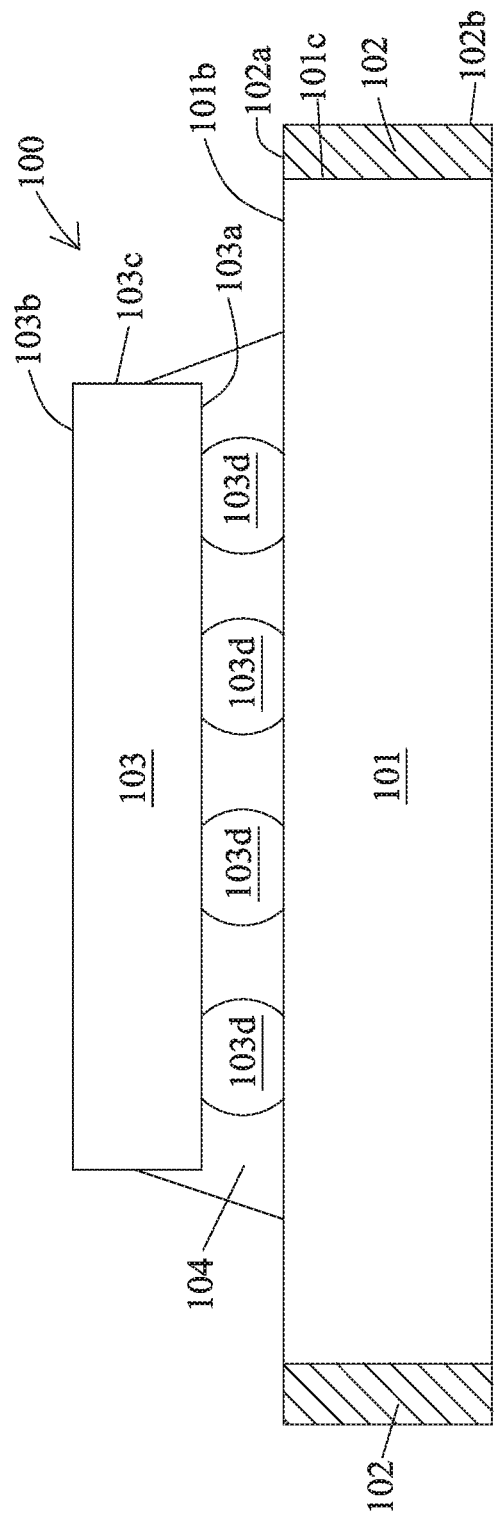

In operation 303, a die 103 is bonded over the substrate 101 as shown in FIG. 5C. In some embodiments, the die 103 is a logic device die, graphics processing unit (GPU) die, application processing (AP) die, memory die, high bandwidth memory (HBM) die or the like. In some embodiments, the die 103 is a chip or a package. In some embodiments, the die 103 includes a fourth surface 103a facing to the second surface 101b of the substrate 101, a fifth surface 103b opposite to the fourth surface 103a and a third sidewall 103c substantially orthogonal to the fourth surface 103a and the fifth surface 103b. In some embodiments, the third sidewall 103c is extended between the fourth surface 103a and the fifth surface 103b. In some embodiments, the die 103 has configuration similar to the one described above or illustrated in FIG. 1, 2 or 3.

In some embodiments, the die 103 is bonded over the second surface 101b of the substrate 101 by a second conductive bump 103d. In some embodiments, the die 103 is electrically connected to the substrate 101 through the second conductive bump 103d. In some embodiments, the second conductive bump 103d is disposed at the fourth surface 103a of the die 103 and the second surface 101b of the substrate 101. In some embodiments, the die 103 is electrically connected to the substrate 101 through the second conductive bump 103d. In some embodiments, the second conductive bump 103d includes low-temperature reflowable material, such as solder, a lead-free solder, etc. In some embodiments, the second conductive bump 103d includes lead, tin, copper, gold, nickel or the like or combination thereof. In some embodiments, the second conductive bump 103d is a solder ball, a flip chip bump, a ball grid array (BGA) ball, a controlled collapse chip connection (C4) bump, a microbump, a pillar or the like. In some embodiments, the second conductive bump 103d is disposed by ball mounting, stencil pasting or any other suitable operations. In some embodiments, the second conductive bump 103d has configuration similar to the one described above or illustrated in FIG. 1, 2 or 3.

In some embodiments, an underfill material 104 is disposed over the substrate 101 and surrounds the die 103 and the second conductive bump 103d. In some embodiments, the underfill material 104 is in contact with the third sidewall 103c of the die 103, the second surface of the substrate 101 and the second conductive bump 103d. In some embodiments, the underfill material 104 fills spacing between two adjacent second conductive bumps 103d. In some embodiments, the underfill material 104 is an electrically insulated adhesive for protecting the second conductive bump 103d or securing a bonding between the die 103 and the substrate 101. In some embodiments, the underfill material 104 includes epoxy, resin, epoxy molding compounds or etc. In some embodiments, the underfill material 104 is disposed by flowing, injection or any other suitable operations. In some embodiments, the underfill material 104 has configuration similar to the one described above or illustrated in FIG. 1, 2 or 3. In some embodiments, a semiconductor structure 100 is formed.

Figure 5D:
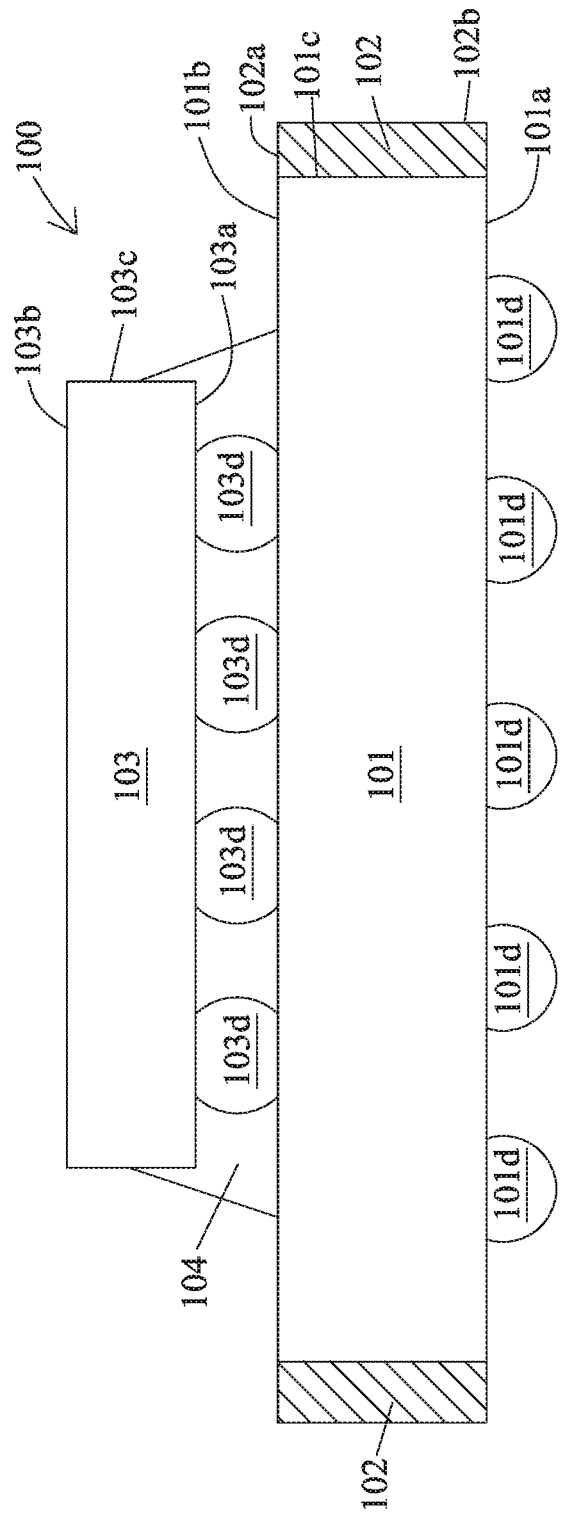

In operation 304, a first conductive bump 101d is disposed at the first surface 101a of the substrate 101 as shown in FIG. 5D. In some embodiments, the first conductive bump 101d is electrically connected to the substrate 101. In some embodiments, the first conductive bump 101d is configured to bond with a conductive structure. In some embodiments, the first conductive bump 101d includes low-temperature reflowable material, such as solder, a lead-free solder, etc. In some embodiments, the first conductive bump 101d includes lead, tin, copper, gold, nickel or the like or combination thereof. In some embodiments, the first conductive bump 101d is a solder ball, a ball grid array (BGA) ball, a controlled collapse chip connection (C4) bump, a microbump, a pillar or the like. In some embodiments, the first conductive bump 101d is disposed by ball mounting, stencil pasting or any other suitable operations. In some embodiments, the first conductive bump 101d has configuration similar to the one described above or illustrated in FIG. 1, 2 or 3.

Figure 6:
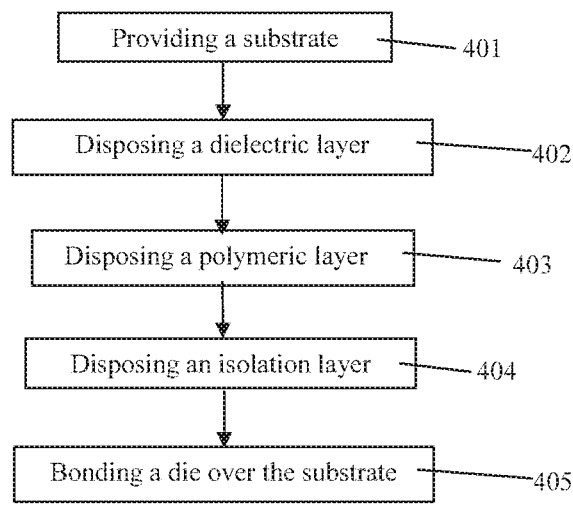
FIG. 6 is a flow diagram of a method of manufacturing a semiconductor structure in accordance with some embodiments of the present disclosure.

In some embodiments, a semiconductor structure 200 is formed by a method 400. The method 400 includes a number of operations and the description and illustration are not deemed as a limitation as the sequence of the operations. FIG. 6 is an embodiment of the method 400 of manufacturing the semiconductor structure 200. The method 400 includes a number of operations (401, 402, 403, 404 and 405).

Figure 7A:
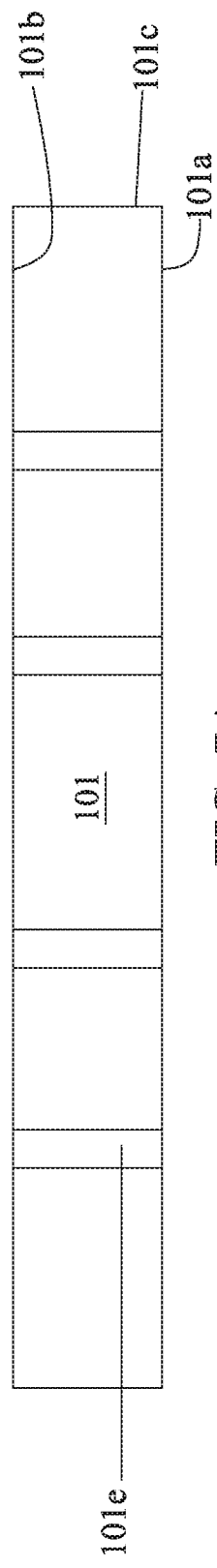
FIGS. 7A-7E are schematic views of manufacturing a semiconductor structure by a method of FIG. 6 in accordance with some embodiments of the present disclosure.

In operation 401, a substrate 101 is received or provided as shown in FIG. 7A. In some embodiments, the operation 401 is similar to the operation 301. In some embodiments, the substrate 101 includes a first surface 101a, a second surface 101b opposite to the first surface 101a.

In some embodiments, a via 101e is formed within the substrate 101. In some embodiments, the via 101e is extended through the substrate 101. In some embodiments, the via 101e is extended between the first surface 101a and the second surface 101b of the substrate 101. In some embodiments, the via 101e is formed by removing a portion of the substrate 101 to form an opening and disposing a conductive material into the opening. In some embodiments, the removal of the portion of the substrate 101 includes photolithography, etching or any other suitable operations. In some embodiments, the disposing of the conductive material includes electroplating, sputtering or any other suitable operations. In some embodiments, the conductive material includes copper, silver, gold, aluminum, etc. In some embodiments, the via 101e is a through substrate via or a through silicon via (TSV). In some embodiments, the via 101e has configuration similar to the one described above or illustrated in FIG. 3.

Figure 7B:
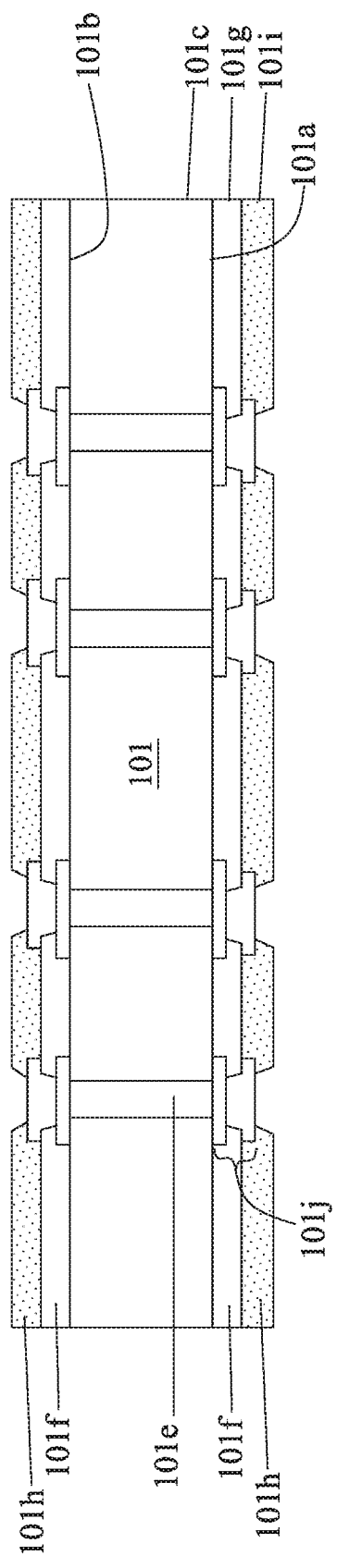

In operation 402, a dielectric layer 101f is disposed over or below the substrate 101 as shown in FIG. 7B. In some embodiments, the dielectric layer 101f is disposed over the second surface 101b or below the first surface 101a of the substrate 101. In some embodiments, the dielectric layer 101f includes dielectric material such as silicon oxide, silicon carbide, silicon oxynitride, silicon nitride or the like.

In some embodiments, the dielectric layer 101f is disposed by any suitable operation such as chemical vapor deposition (CVD), spin coating, oxidation or the like. In some embodiments, the dielectric layer 101f has configuration similar to the one described above or illustrated in FIG. 3.

In operation 403, a polymeric layer 101h is disposed over or below the dielectric layer 101f as shown in FIG. 7B. In some embodiments, the polymeric layer 101h includes polymeric material such as solder mask, solder resist, epoxy, polyimide (PI), polybenzoxazole (PBO) or the like. In some embodiments, the polymeric layer 101h is disposed by spin coating, screening or any other suitable operations. In some embodiments, the polymeric layer 101h has configuration similar to the one described above or illustrated in FIG. 3.

In some embodiments, the dielectric layer 101f is sawn to form a fourth sidewall 101g. In some embodiments, several protrusions or several recesses are formed on the fourth sidewall 101g of the dielectric layer 101f after the singulation, cutting or sawing operations. In some embodiments, the protrusions and the recesses are formed over a portion of the fourth sidewall 101g. In some embodiments, the protrusions and the recesses formed on the fourth sidewall 101g are cracks which are developed during the singulation, cutting or sawing operations. In some embodiments, chippings are formed during the singulation, cutting or sawing operations, and those chippings collide with the dielectric layer 101f to form cracks on the dielectric layer 101f.

In some embodiments, a roughness of the fourth sidewall 101g is substantially greater than a roughness of the first surface 101a, a roughness of the second surface 101b of the substrate 101 or a roughness of a surface of the dielectric layer 101f between the dielectric layer 101f and the polymeric layer 101h, because the fourth sidewall 101g has undergone the singulation, cutting or sawing operations. In some embodiments, the roughness of the fourth sidewall 101g is substantially different from the roughness of the first surface 101a, the roughness of the second surface 101b of the substrate 101, or the roughness of a surface of the dielectric layer 101f between the dielectric layer 101f and the polymeric layer 101h.

In some embodiments, the polymeric layer 101h is sawn to form a fifth sidewall 101i. In some embodiments, several protrusions or several recesses are formed on the fifth sidewall 101i of the polymeric layer 101h after the singulation, cutting or sawing operations. In some embodiments, the protrusions and the recesses are formed over a portion of the fifth sidewall 101i. In some embodiments, the protrusions and the recesses formed on the fifth sidewall 101i are cracks which are developed during the singulation, cutting or sawing operations. In some embodiments, chippings are formed during the singulation, cutting or sawing operations, and those chippings collide with the polymeric layer 101h to form cracks on the polymeric layer 101h.

In some embodiments, a roughness of the fifth sidewall 101i is substantially greater than the roughness of the first surface 101a, the roughness of the second surface 101b of the substrate 101, or a roughness of an exposed surface of the polymeric layer 101h, because the fifth sidewall 101i has undergone the singulation, cutting or sawing operations. In some embodiments, the roughness of the fifth sidewall 101i is substantially different from the roughness of the first surface 101a, the roughness of the second surface 101b of the substrate 101, or the roughness of an exposed surface of the polymeric layer 101h.

In some embodiments, a conductive member 101j is formed within the dielectric layer 101f and the polymeric layer 101h as shown in FIG. 7B. In some embodiments, a conductive member 101j is surrounded by the dielectric layer 101f or the polymeric layer 101h. In some embodiments, the conductive member 101j is extended within the dielectric layer 101f or within the polymeric layer 101h. In some embodiments, the conductive member 101j is electrically connected with the via 101e. In some embodiments, the conductive member 101j is disposed over or below the via 101e. In some embodiments, the conductive member 101j is a conductive pad, a conductive line, a bump pad, an interconnect structure or the like.

In some embodiments, the conductive member 101j is formed by removing a portion of the dielectric layer 101f or a portion of the polymeric layer 101h to form an opening, and then disposing a conductive material into the opening. In some embodiments, the removal of the portion of the dielectric layer 101f or the polymeric layer 101h includes photolithography, etching or any other suitable operations. In some embodiments, the disposing of the conductive material includes electroplating, sputtering or any other suitable operations. In some embodiments, the conductive material includes copper, silver, gold, aluminum, etc. In some embodiments, the conductive member 101j has configuration similar to the one described above or illustrated in FIG. 3.

Figure 7C:
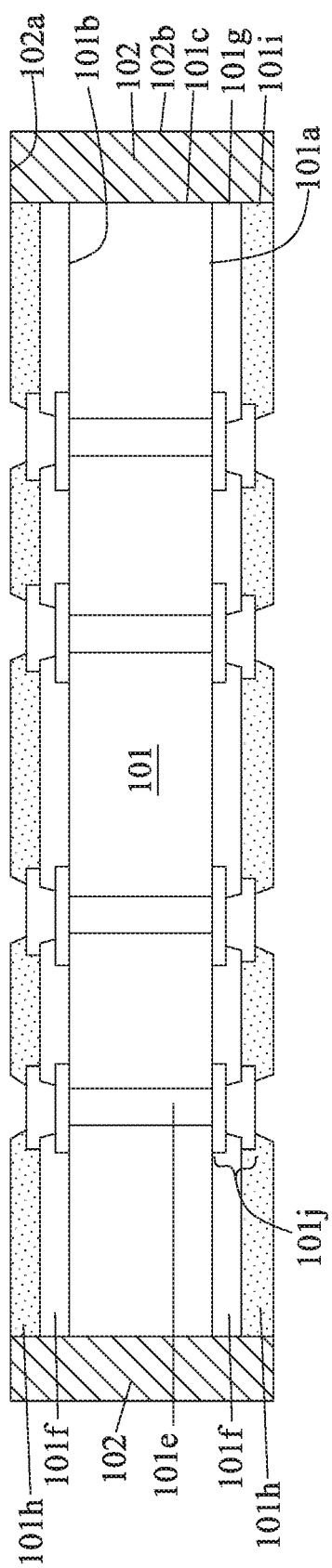

In operation 404, an isolation layer 102 is disposed as shown in FIG. 7C. In some embodiments, the isolation layer 102 surrounds and contacts with the substrate 101, the dielectric layer 101f and the polymeric layer 101h. In some embodiments, the isolation layer 102 is disposed by coating, rolling, sticking, molding or any other suitable operations. In some embodiments, the isolation layer 102 is configured to protect the substrate 101, the dielectric layer 101f and the polymeric layer 101h from damages, chippings or other contaminations. In some embodiments, the isolation layer 102 is configured to prevent propagation of cracks into the substrate 101, the dielectric layer 101f and the polymeric layer 101h. In some embodiments, the isolation layer 102 is configured to seal the cracks formed on the substrate 101, the dielectric layer 101f or the polymeric layer 101h.

In some embodiments, the isolation layer 102 includes polymeric, metallic or conductive material. In some embodiments, the isolation layer 102 includes solder mask, solder resist, epoxy, polyimide (PI), polybenzoxazole (PBO), molding compound or the like. In some embodiments, the isolation layer 102 includes aluminum, copper, nickel, gold, silver or the like. In some embodiments, the isolation layer 102 is a polymeric film. In some embodiments, the isolation layer 102 has configuration similar to the one described above or illustrated in FIG. 1, 2 or 3.

Figure 7D:
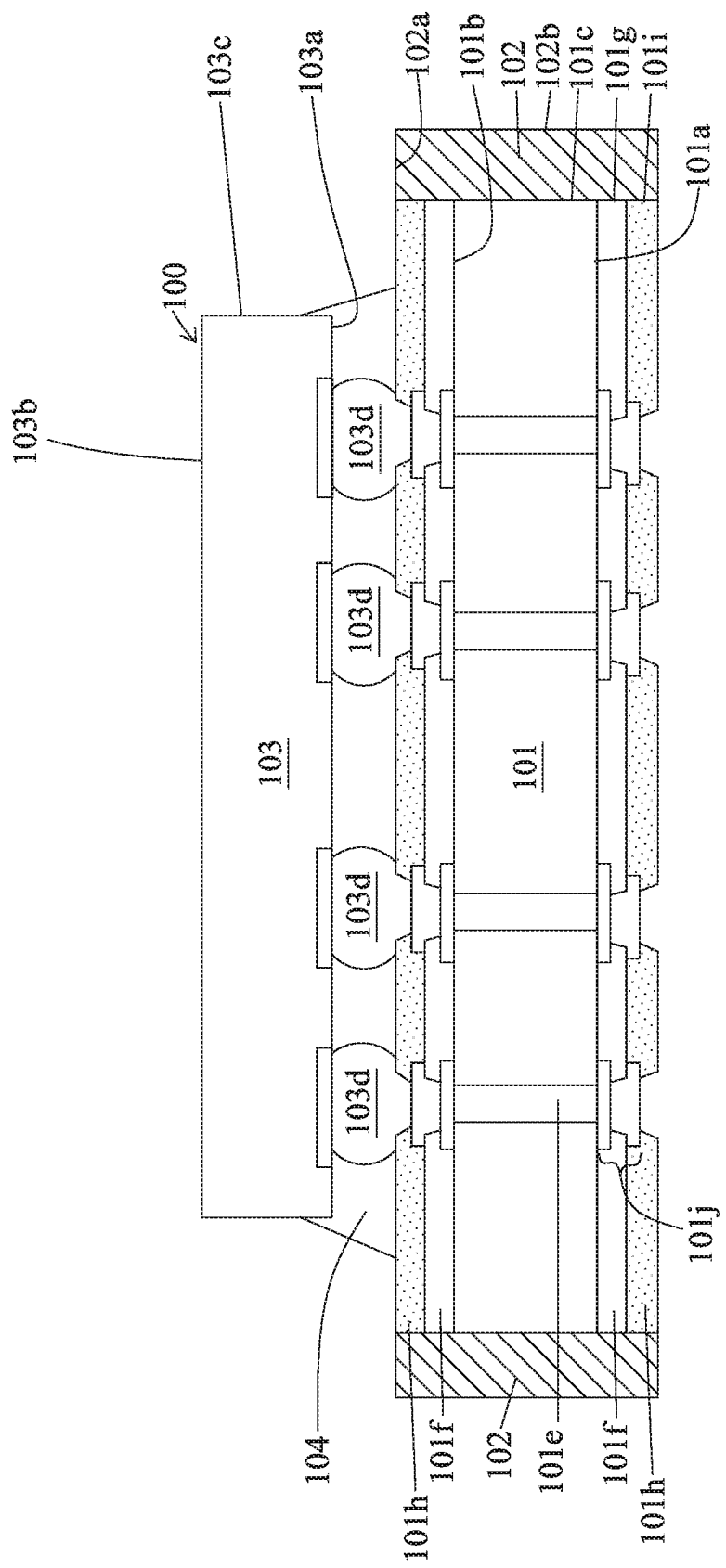

In operation 405, a die 103 is disposed over the substrate 101 as shown in FIG. 7D. In some embodiments, the operation 405 is same as the operation 303. In some embodiments, the die 103 is bonded over the substrate 101 by a second conductive bump 103d. In some embodiments, the die 103 and the second conductive bump 103d have configurations similar to those described above or illustrated in FIG. 1, 2 or 3.

Figure 7E:
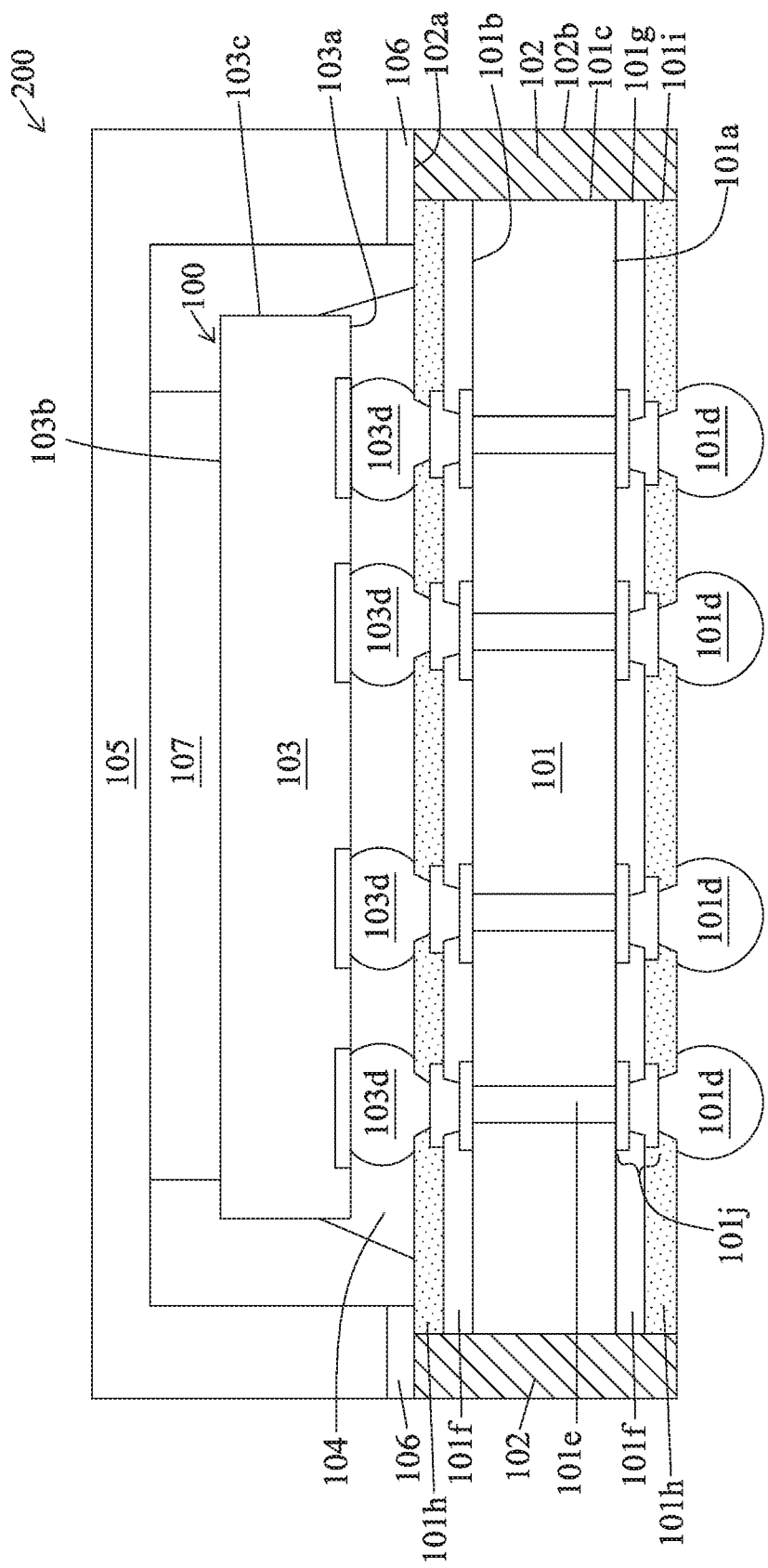

In some embodiments, a first conductive bump 101d is disposed over or below the conductive member 101j as shown in FIG. 7E. In some embodiments, the disposing of the first conductive bump 101d is similar to the operation 304. In some embodiments, the first conductive bump 101d is protruded from the polymeric layer 101h. In some embodiments, the die 103 is electrically connected to the first conductive bump 101d through the second conductive bump 103d, the via 101e, and the conductive member 101j.

In some embodiments as shown in FIG. 7E, a heat dissipation member 105 is disposed over the die 103, the substrate 101 and the isolation layer 102. In some embodiments, the heat dissipation member 105 is attached to the isolation layer 102 by an adhesive 106. In some embodiments, the heat dissipation member 105 is attached to a portion of the isolation layer 102 and a portion of the polymeric layer 101h by the adhesive 106. In some embodiments, the heat dissipation member 105 is attached to the polymeric layer 101h by the adhesive 106. In some embodiments, the heat dissipation member 105 is a heat sink or a heat spreader. In some embodiments, the heat dissipation member 105 has configuration similar to the one described above or illustrated in FIG. 3.

In some embodiments, a thermal interface material (TIM) 107 is disposed between the heat dissipation member 105 and the die 103. In some embodiments, the TIM 107 is thermal adhesive, thermal gel, thermal tape or the like. In some embodiments, the TIM 107 is disposed by flowing, injection or any other suitable operations. In some embodiments, the TIM 107 has configuration similar to the one described above or illustrated in FIG. 3.

In the present disclosure, a semiconductor structure includes an isolation layer disposed over a sidewall of a substrate. The substrate is sawn upon fabrication, and thus cracks are formed at the sidewall or chippings are formed and collided with the substrate upon fabrication. The sidewall of the substrate is covered by the isolation layer, such that cracks would not propagate into the substrate, and chippings or other contaminations would not enter into or collide with the substrate. Therefore, damages on the substrate, delamination of components on the substrate, and propagation of cracks into the substrate would be minimized or prevented.

In some embodiments, a semiconductor structure includes a substrate including a first surface, a second surface opposite to the first surface, a first sidewall substantially orthogonal to the first surface and the second surface; an isolation layer surrounding and contacted with the first sidewall of the substrate; a die disposed over the second surface of the substrate; a first conductive bump disposed at the first surface of the substrate; and a second conductive bump disposed between the substrate and the die.

In some embodiments, the isolation layer entirely covers the first sidewall of the substrate. In some embodiments, the isolation layer includes polymeric or metallic material. the isolation layer is in a strip or frame shape. In some embodiments, the isolation layer includes a third surface and a second sidewall substantially orthogonal to the third surface, the third surface is substantially coplanar with the first surface or the second surface of the substrate, and the second sidewall is substantially parallel to the first sidewall of the substrate.

In some embodiments, a semiconductor structure includes a substrate including a first surface and a second surface opposite to the first surface; a dielectric layer disposed over the second surface or below the first surface; a polymeric layer disposed over or below the dielectric layer; an isolation layer surrounding and contacted with the substrate, the dielectric layer and the polymeric layer; a die disposed over the polymeric layer; a first conductive bump disposed below the first surface of the substrate; and a second conductive bump disposed between the second surface of the substrate and the die.

In some embodiments, the isolation layer surrounds and contacts with sidewalls of the substrate, the dielectric layer and the polymeric layer. In some embodiments, the isolation layer entirely covers the sidewalls of the substrate, the dielectric layer and the polymeric layer. In some embodiments, the sidewalls of the substrate, the dielectric layer and the polymeric layer are substantially coplanar with each other. In some embodiments, an interface between the isolation layer, the substrate, the dielectric layer and the polymeric layer is substantially orthogonal to the first surface or the second surface of the substrate. In some embodiments, the semiconductor structure further includes a heat dissipation member disposed over the die, the substrate and the isolation layer. In some embodiments, the heat dissipation member is disposed over at least a portion of the polymeric layer and at least a portion of the dielectric layer. In some embodiments, the heat dissipation member is attached to the isolation layer or the polymeric layer by an adhesive. In some embodiments, the semiconductor structure further includes a thermal interface material (TIM) disposed between the heat dissipation member and the die. In some embodiments, the semiconductor structure further includes a conductive member surrounded by the polymeric layer or the dielectric layer, wherein the conductive member is electrically connected to the first conductive bump or the second conductive bump. In some embodiments, the semiconductor structure further includes a via extended through the substrate, wherein the via is surrounded by the isolation layer and is electrically connected to the first conductive bump, the second conductive bump or the die. In some embodiments, the semiconductor structure further includes an underfill material surrounding the second conductive bump and a portion of the die.

In some embodiments, a method of manufacturing a semiconductor structure includes providing a substrate including a first surface, a second surface opposite to the first surface, a sidewall substantially orthogonal to the first surface and the second surface; disposing an isolation layer surrounding and contacted with the sidewall of the substrate; bonding a die over the second surface of the substrate by a second conductive bump; and disposing a first conductive bump at the first surface of the substrate.

In some embodiments, the disposing of the isolation layer includes coating, rolling, sticking or molding operations. In some embodiments, the method further includes cutting the substrate to form the sidewall of the substrate prior to the disposing of the isolation layer.

In some embodiments, a semiconductor structure includes a substrate including a first surface and a second surface opposite to the first surface; a dielectric layer disposed over the second surface or below the first surface; a polymeric layer disposed over or below the dielectric layer; an isolation layer surrounding and contacted with the substrate, the dielectric layer and the polymeric layer; a die disposed over the polymeric layer; a first conductive bump disposed below the first surface of the substrate; and a second conductive bump disposed between the second surface of the substrate and the die.

In some embodiments, the isolation layer surrounds and contacts with sidewalls of the substrate, the dielectric layer and the polymeric layer. In some embodiments, the isolation layer entirely covers the sidewalls of the substrate, the dielectric layer and the polymeric layer. In some embodiments, the sidewalls of the substrate, the dielectric layer and the polymeric layer are substantially coplanar with each other. In some embodiments, the semiconductor structure includes an interface between the isolation layer, the substrate, the dielectric layer and the polymeric layer is substantially orthogonal to the first surface or the second surface of the substrate. In some embodiments, the semiconductor structure further includes a heat dissipation member disposed over the die, the substrate and the isolation layer. In some embodiments, the heat dissipation member is disposed over at least a portion of the polymeric layer and at least a portion of the dielectric layer. In some embodiments, the heat dissipation member is attached to the isolation layer and the polymeric layer by an adhesive. In some embodiments, the semiconductor structure further includes a thermal interface material (TIM) disposed between the heat dissipation member and the die. In some embodiments, the semiconductor structure further includes a conductive member surrounded by the polymeric layer or the dielectric layer, wherein the conductive member is electrically connected to the first conductive bump or the second conductive bump. In some embodiments, the semiconductor structure further includes a via extended through the substrate, wherein the via is surrounded by the isolation layer and is electrically connected to the first conductive bump, the second conductive bump or the die.

In some embodiments, a semiconductor structure includes a substrate including a first surface and a second surface opposite to the first surface; a polymeric layer disposed over the second surface or below the first surface; an isolation layer surrounding and contacted with the substrate and the polymeric layer; a die disposed over the polymeric layer; and a conductive bump disposed between the die and the polymeric layer, wherein the isolation layer includes a third surface substantially coplanar with a fourth surface of the polymeric layer.

In some embodiments, the isolation layer extends along sidewalls of the substrate and the polymeric layer. In some embodiments, the third surface and the fourth surface are substantially parallel to the first surface or the second surface. In some embodiments, a portion of the fourth surface of the polymeric layer is exposed. In some embodiments, the semiconductor structure further includes a heat dissipation member disposed over the die, the polymeric layer and the isolation layer. In some embodiments, the semiconductor structure further includes an underfill material surrounding the conductive bump and contacted with the polymeric layer.

In some embodiments, a method of manufacturing a semiconductor structure includes providing a substrate including a first surface, a second surface opposite to the first surface, a sidewall substantially orthogonal to the first surface and the second surface; disposing a polymeric layer over the second surface or below the first surface; disposing an isolation layer surrounding and contacted with sidewalls of the substrate and the polymeric layer; and bonding a die over the polymeric layer by a conductive bump.

In some embodiments, the disposing of the isolation layer is performed after the disposing of the polymeric layer. In some embodiments, the sidewall of the substrate is formed by singulation operations.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate including a first surface and a second surface opposite to the first surface;
a dielectric layer disposed over the second surface or below the first surface;
a polymeric layer disposed over or below the dielectric layer;
an isolation layer surrounding and contacted with the substrate, the dielectric layer and the polymeric layer;
a die disposed over the polymeric layer;
a first conductive bump disposed below the first surface of the substrate; and
a second conductive bump disposed between the second surface of the substrate and the die,
wherein the isolation layer includes a first exposed surface, the polymeric layer includes a second exposed surface, the first exposed surface and the second exposed surface are substantially parallel to the first surface or the second surface.

2. The semiconductor structure of claim 1, wherein the isolation layer surrounds and contacts with sidewalls of the substrate, the dielectric layer and the polymeric layer.

3. The semiconductor structure of claim 2, wherein the isolation layer entirely covers the sidewalls of the substrate, the dielectric layer and the polymeric layer.

4. The semiconductor structure of claim 2, wherein the sidewalls of the substrate, the dielectric layer and the polymeric layer are substantially coplanar with each other.

5. The semiconductor structure of claim 1, wherein an interface between the isolation layer, the substrate, the dielectric layer and the polymeric layer is substantially orthogonal to the first surface or the second surface of the substrate.

6. The semiconductor structure of claim 1, further comprising a heat dissipation member disposed over the die, the substrate and the isolation layer.

7. The semiconductor structure of claim 6, wherein the heat dissipation member is disposed over at least a portion of the polymeric layer and at least a portion of the dielectric layer.

8. The semiconductor structure of claim 6, wherein the heat dissipation member is attached to the isolation layer and the polymeric layer by an adhesive.

9. The semiconductor structure of claim 6, further comprising a thermal interface material (TIM) disposed between the heat dissipation member and the die.

10. The semiconductor structure of claim 1, further comprising a conductive member surrounded by the polymeric layer or the dielectric layer, wherein the conductive member is electrically connected to the first conductive bump or the second conductive bump.

11. The semiconductor structure of claim 1, further comprising a via extended through the substrate, wherein the via is surrounded by the isolation layer and is electrically connected to the first conductive bump, the second conductive bump or the die.

12. A semiconductor structure, comprising:
a substrate including a first surface and a second surface opposite to the first surface;
a polymeric layer disposed over the second surface or below the first surface;
an isolation layer surrounding and contacted with the substrate and the polymeric layer;
a die disposed over the polymeric layer; and
a conductive bump disposed between the die and the polymeric layer,
wherein the isolation layer includes a third surface substantially coplanar with a fourth surface of the polymeric layer, and the third surface and the fourth surface are substantially parallel to the first surface or the second surface.

13. The semiconductor structure of claim 12, wherein the isolation layer extends along sidewalls of the substrate and the polymeric layer.

14. The semiconductor structure of claim 12, wherein the conductive bump is surrounded by the polymeric layer.

15. The semiconductor structure of claim 12, wherein a portion of the fourth surface of the polymeric layer is exposed.

16. The semiconductor structure of claim 12, further comprising a heat dissipation member disposed over the die, the polymeric layer and the isolation layer.

17. The semiconductor structure of claim 12, further comprising an underfill material surrounding the conductive bump and contacted with the polymeric layer.

18. A method of manufacturing a semiconductor structure, comprising:
providing a substrate including a first surface, a second surface opposite to the first surface, a sidewall substantially orthogonal to the first surface and the second surface;
disposing a polymeric layer over the second surface or below the first surface;
disposing an isolation layer surrounding and contacted with sidewalls of the substrate and the polymeric layer; and
bonding a die over the polymeric layer by a conductive bump,
wherein the isolation layer includes a third surface substantially coplanar with a fourth surface of the polymeric layer, and the third surface and the fourth surface are substantially parallel to the first surface or the second surface.

19. The method of claim 18, wherein the disposing of the isolation layer is performed after the disposing of the polymeric layer.

20. The method of claim 18, wherein the sidewall of the substrate is formed by singulation operations.

* * * * *